United States Patent
Komoda

Patent Number: 6,076,178
Date of Patent: Jun. 13, 2000

[54] TEST CIRCUIT AND METHOD FOR DC TESTING LSI CAPABLE OF PREVENTING SIMULTANEOUS CHANGE OF SIGNALS

[75] Inventor: Michio Komoda, Hyogo, Japan

[73] Assignee: Mitsubishi Denki Kabushiki Kaisha, Tokyo, Japan

[21] Appl. No.: 09/037,037

[22] Filed: Mar. 9, 1998

[30] Foreign Application Priority Data

Sep. 3, 1997 [JP] Japan ................................. 9-238237

[51] Int. Cl.[7] ........................................... G01R 31/28
[52] U.S. Cl. ........................................................ 714/727
[58] Field of Search ................................. 714/727, 726, 714/729, 731

[56] References Cited

U.S. PATENT DOCUMENTS 4,825,439 4/1989 Sakashita et al. ........................ 371/15
5,221,865 6/1993 Phillips et al. ........................... 307/465

FOREIGN PATENT DOCUMENTS 4-50678 2/1992 Japan.
6-300814 10/1994 Japan.

Primary Examiner—Albert De Cady
Assistant Examiner—Samuel Lin
Attorney, Agent, or Firm—McDermott, Will & Emery

[57] ABSTRACT

A test circuit for DC testing which has a simple layout design and never causes malfunction due to simultaneous change of outputs includes test circuits connected to inputs of output allowable buffers. The test circuits are connected in a circle so that a value retained in each circuit can be applied to the adjacent test circuit. In the DC testing using the test circuit for DC testing, values which are retained in and output from output allowable buffers are circulated between the output allowable buffers. At the time, the values retained in the test circuit are changed within the range of the number allowable for simultaneous change.

8 Claims, 7 Drawing Sheets

TEST CIRCUIT AND METHOD FOR DC TESTING LSI CAPABLE OF PREVENTING SIMULTANEOUS CHANGE OF SIGNALS

BACKGROUND OF THE INVENTION

1. Field of the Invention

The present invention relates to test circuits for DC testing and methods for DC testing using the same. The invention particularly relates to a test circuit for DC testing which has a simple layout design and never causes malfunction due to simultaneous change of signals, and a method of DC testing using the same.

2. Description of the Background Art

In manufacturing an LSI (Large Scale Integration), DC (Direct Current) characteristics of output allowable buffers are generally measured as a manufacturing test. The output allowable buffers include an output buffers, a tristate buffer, a bidirectional buffer or the like. In DC testing, the output allowable buffers must be tested when L (Low) potential is output and also when H (High) potential is output. Thus, in DC testing, the output allowable buffers must assume, at least once, a state in which all of its outputs are low and a state in which all of its outputs are high, respectively.

Conventionally, DC testing is performed using a function pattern for verifying the function of an LSI which is prepared by an LSI designer.

Referring to FIG. 1, a conventional DC test unit for output buffers includes: a function pattern storage 1 for storing a function pattern prepared by a designer; a measuring period analysis unit 2 connected to function pattern storage 1 and analyzing periods at which a plurality of output allowable buffers must be DC tested based on the function pattern; a measuring period storage 3 connected to measuring period analysis unit 2 and storing analysis result from measuring period analysis unit 2; a pattern supply unit 4 connected to function pattern storage 1 and measuring period storage 3, and supplying the function pattern for an LSI under measurement in accordance with the measuring period; a mounting portion for the LSI under measurement 6 mounting the LSI under measurement and receiving the pattern from pattern supply unit 4; and a DC measurement unit 5 connected to measuring period storage 3 and performing DC testing of an LSI under measurement mounted to mounting portion for the LSI under measurement 6 for each measuring period.

The function pattern prepared by the designer for LSI verification is stored in function pattern storage 1. Function pattern storage 1 is implemented in the form of storage such as an HDD (Hard Disk Drive).

Measuring period analysis unit 2 receives the function pattern from function pattern storage 1 and extracts the periods during which L and H signals are output, respectively, for each of the plurality of output allowable buffers. Generally, each output allowable buffer has a plurality of periods during which L or H signals are output. A minimized measuring period is calculated based on the outputs of L and H signals from each output enable buffer, so that DC testing is efficiently performed. The measuring period, a name of the output allowable buffer which can be measured with the measuring period, and an output potential (an output value) of the output allowable buffer are stored in measuring period storage 3. Generally, the analysis is preliminary executed by a computer.

Pattern supply unit 4, DC measurement unit 5 and mounting portion for an LSI under measurement 6 are contained in a usual LSI tester.

DC testing of the LSI under measurement is performed based on the function pattern and the measuring period. Pattern supply unit 4 supplies the function pattern, which has been stored in function pattern storage 1, for the LSI under measurement mounted on mounting portion for an LSI under measurement 6. Pattern supply unit 4 stops the supply of the function pattern when the measuring period is attained, and DC measurement unit 5 performs DC testing of the output allowable buffer which can be measured.

The DC testing however suffers from the following disadvantages. The DC testing is performed using the function pattern prepared by the designer. Thus, such function pattern must be prepared such that the output allowable buffers can be brought into the states in which all of its outputs are at L and H, respectively. As a result, the function pattern cannot be quickly produced and tends to be large in size. In addition, as the number of output allowable buffers increases, it becomes more difficult to make all the outputs from the output allowable buffers L or H outputs simultaneously. As a result, the number of periods for DC testing increases, thereby reducing test efficiency.

To solve this problem, there exists a method of readily preparing the function pattern required for DC testing by adding a test circuit for DC testing to the LSI.

Referring to FIG. 2, the LSI having the test circuit for DC testing includes: a system logic 9 constituting a system; selectors 8a to 8d each selecting and outputting one of an output value from system logic 9 and a value of a DCtest-DataIn signal line 11 in accordance with a value of a DCtestSelect signal line 10; and output buffers 7a to 7d respectively connected to the outputs from selectors 8a to 8d for outputting the output values from selectors 8a to 8d. It is noted that input buffers and those output buffers which are not subject to DC testing are not shown in FIG. 2 for clarity of the drawing. The test circuit can control the output values from output buffers 7a to 7d by setting the value of DCtestSelect signal line 10 such that each of selectors 8a to 8d outputs the value of DCtestDataIn signal line 11. Thus, the function pattern can readily be generated, minimizing the period for DC measuring.

In a method of DC testing using the LSI including the conventional test circuit for DC testing, however, all of the output values from output buffers 7a to 7d are simultaneously changed from L to H or H to L. Such simultaneous change of the outputs possibly causes malfunction of the LSI per se, thereby disadvantageously preventing stable DC testing.

One method of testing an integrated circuit is disclosed in Japanese Patent Laying-Open No. 6-300814 as solving the problem related to the simultaneous change of outputs. In the method, output allowable buffers are divided into several groups to prevent the simultaneous change of outputs, and each group is DC tested in a similar manner as described above. In dividing the output allowable buffers into several groups to prevent the simultaneous change of the outputs, power supply sources of the output allowable buffers included in one group must be selected as separately as possible. However, the output allowable buffers connected to the same power supply pin are generally close to each other in the space, so that the output allowable buffers connected to different power supply pins are mutually spaced apart. Thus, addition of a test circuit to the output allowable buffers which are divided into groups to prevent the simultaneous change of the outputs causes another problem, that is, difficulty in layout design associated with the lengthy distribution of wires in the LSI.

SUMMARY OF THE INVENTION

The present invention is made to solve the aforementioned problems. An object of the present invention is to provide a test circuit for DC testing which has a simple layout design and never causes malfunction of the circuit due to simultaneous change of its outputs, and a method of DC testing using the same.

Another object of the present invention is to provide a method of DC testing using a test circuit for DC testing which minimizes the number of circuits added to the LSI, has a simple layout design and never causes malfunction of the circuit due to simultaneous change of its outputs.

A test circuit for DC testing of an LSI according to one aspect of the present invention is capable of retaining values output from a plurality of output allowable buffers and includes: a plurality of test circuits supplying values for the plurality of output allowable buffers; a selector; and a signal line connecting the plurality of test circuits and the selector in a circle for circulating the values retained in the plurality of test circuits therebetween. The selector is connected to a first test circuit included in the plurality of test circuits and a data signal line, and is responsive to a selection signal for selecting one of the value retained in the first test circuit and a value of the data signal line and for supplying it for a second test circuit included in the plurality of test circuits.

According to the invention, the selector can suitably change the value output from the output allowable buffer while circulating it between the test circuits. Thus, a prescribed value can be set only to the output allowable buffer, which has been selected to prevent malfunction of the circuit due to simultaneous change of its outputs. Accordingly, the test circuit for DC testing which never causes malfunction of the circuit due to simultaneous change of its outputs can be provided. In addition, simple layout design can be achieved as the signal line is simply arranged to interconnect adjacent test circuits in the LSI.

Preferably, the above mentioned test circuit for DC testing further includes an NOT gate for inverting the value retained in the first test circuit and the data signal line is connected to the output of the NOT gate.

According to the invention, the selector can suitably invert the value output from the output allowable buffer while circulating it between the test circuits. Thus, only the output value from the output allowable buffer which has been selected to prevent malfunction of the circuit due to simultaneous change of its outputs can be inverted. Accordingly, the test circuit for DC testing which never causes malfunction of the circuit due to simultaneous change of its outputs can be provided. In addition, simple layout design is achieved as the signal line is only arranged to interconnect adjacent test circuits in the LSI.

A method of DC testing using a test circuit for DC testing according to another aspect of the present invention includes: a step of dividing a plurality of output allowable buffers into groups while satisfying simultaneous change constraint (the number of outputs which are allowed to change simultaneously); a step of circulating values retained in the plurality of test circuits once therebetween and setting prescribed values to outputs from the output allowable buffers in groups; a step of sequentially performing the step of simultaneously setting prescribed values for the output allowable buffers included in each group; and a step of performing DC testing for the plurality of output allowable buffers. Further, the step of simultaneously setting prescribed values includes: a step of setting a prescribed value as a value of a data signal line for a selector; a step of selecting the value of the data signal line and supplying it for a second test circuit by the selector when the output value from the output allowable buffer to which the prescribed value must be set as an input value of the selector during circulation; a step of selecting the output value from the output allowable buffer other than that to which the prescribed value must be set, and supplying it for the second test circuit by the selector when the output value from the output allowable buffer other than that to which the prescribed value must be set as an input value of the selector during circulation; and a step of simultaneously setting the values retained in the plurality of test circuits to the plurality of output allowable buffers.

According to the invention, the selector can suitably change the values currently output from the output allowable buffers while circulating them between the test circuits, and the changed values are simultaneously set to the output allowable buffers through the test circuits. Thus, malfunction of the circuit due to simultaneous change of its outputs is prevented if the number of output allowable buffers whose values are changed satisfies simultaneous change constraint.

A method of DC testing using a boundary scan circuit standardized in IEEE (Institute of Electrical & Electronic Engineers) 1149.1 as a test circuit for DC testing in accordance with still another aspect of the present invention includes: a step of generating a function pattern for DC testing; a step of sequentially and simultaneously setting output voltages of a plurality of output allowable buffers for each group using the function pattern while satisfying simultaneous change constraint; and a step of performing DC testing for the plurality of output enable buffers. The step of generating the function pattern includes: the step of obtaining shift order of the plurality of output allowable buffers from circuit information for an LSI; a step of dividing the plurality of output allowable buffers into groups to satisfy simultaneous change constraint; a step of generating the function pattern for simultaneously inverting the output values from the output allowable buffers in a group for each group based on the shift order of the plurality of output allowable buffers and the output values from the plurality of output allowable buffers.

According to the invention, the plurality of output allowable buffers are divided into groups to satisfy simultaneous change constraint and the values from the output allowable buffers in a group are inverted for each group. Thus, by making the number of output allowable buffers in each group satisfy simultaneous change constraint, malfunction of the circuit due to simultaneous change of its outputs is prevented. Further, the present invention employs the boundary scan circuit standardized in IEEE1149.1 as a test circuit for DC testing. As the boundary scan circuit can also be used as a circuit for board testing, the number of circuits added to the LSI is minimized and layout design is simplified.

Preferably, the step of generating the function pattern includes: a step of obtaining shift order of the plurality of output allowable buffers from circuit information for the LSI; a step of dividing the plurality of output allowable buffers into groups to satisfy simultaneous change constraint; and a step of generating the function pattern for simultaneously setting prescribed values to the outputs from the output allowable buffers in a group for each group based on the shift order of the plurality of output allowable buffers. Further, the step of dividing the plurality of output allowable buffers into groups includes: a step of calculating a first value from the number of the plurality of output allowable buffers and simultaneous change constraint; a step of retrieving output allowable buffers from the plurality of output allowable buffers by the number equal to the first value in accordance with the shift order of the plurality of output allowable buffers and the first value for grouping; and a step of retrieving the output allowable buffer from each group one at a time for further grouping.

According to the invention, the plurality of output allowable buffers are divided into groups to satisfy simultaneous change constraint and the output values from the output allowable buffers in a group are set to prescribe values for each group. Thus, by making the number of the output allowable buffers in each group satisfy simultaneous change constraint, malfunction of the circuit due to simultaneous change of each outputs is prevented. In addition, the present invention employs the boundary scan circuit standardized in IEEE1149.1 as a test circuit for DC testing. As the boundary scan circuit can also be used as a circuit for board testing, the number of circuits added to the LSI can be minimized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
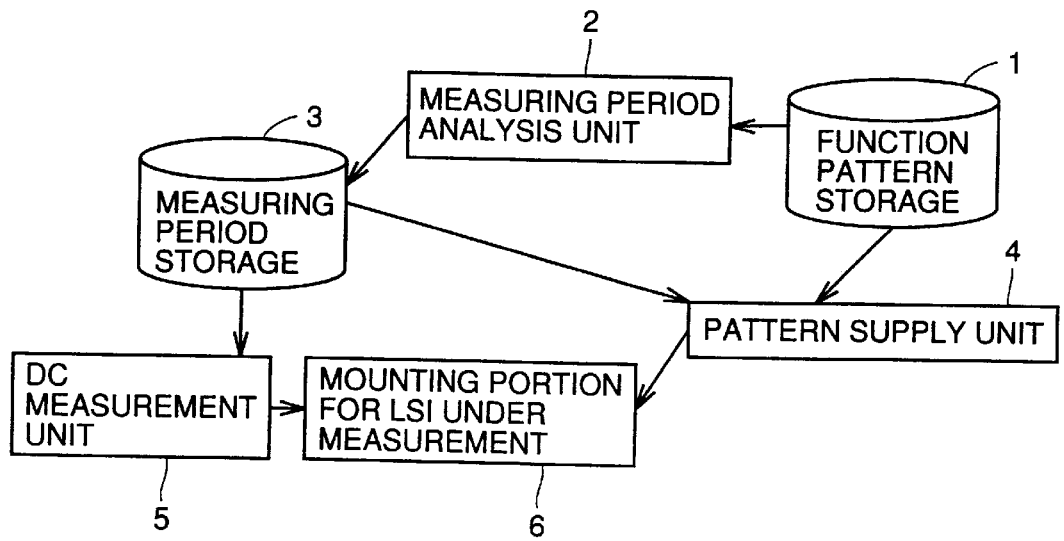
FIG. 1 is a block diagram showing the structure of a DC test unit for output buffers.
Figure 2:
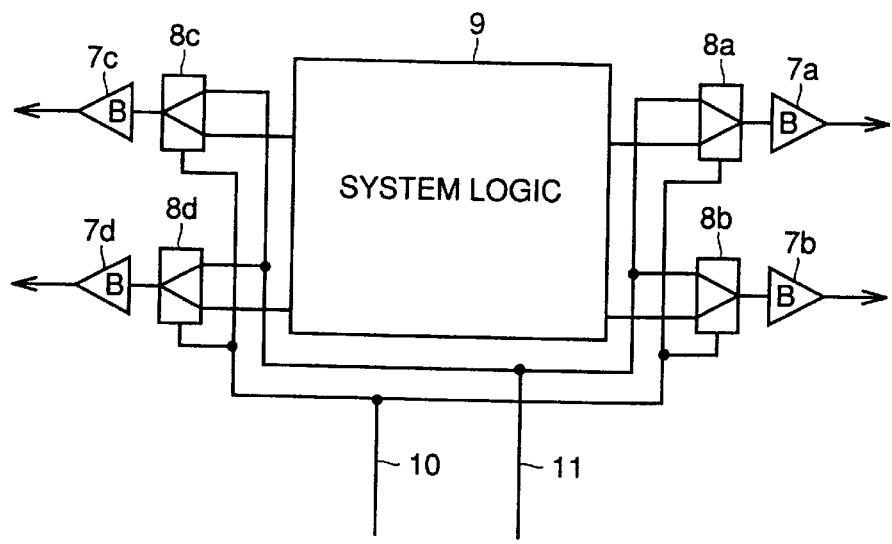
FIG. 2 is a circuit diagram showing an LSI including a conventional test circuit for DC testing.

Referring to the drawings, a DC test unit for output buffers will now be described as one of the embodiments of the present invention. It is noted that in the following description, the same parts have the same reference numerals, names and functions, and therefore the description thereof will not be repeated.

First Embodiment

The conventional unit described with reference to FIG. 1 is used for a DC test unit for output buffers in accordance with a first embodiment.

Figure 3:
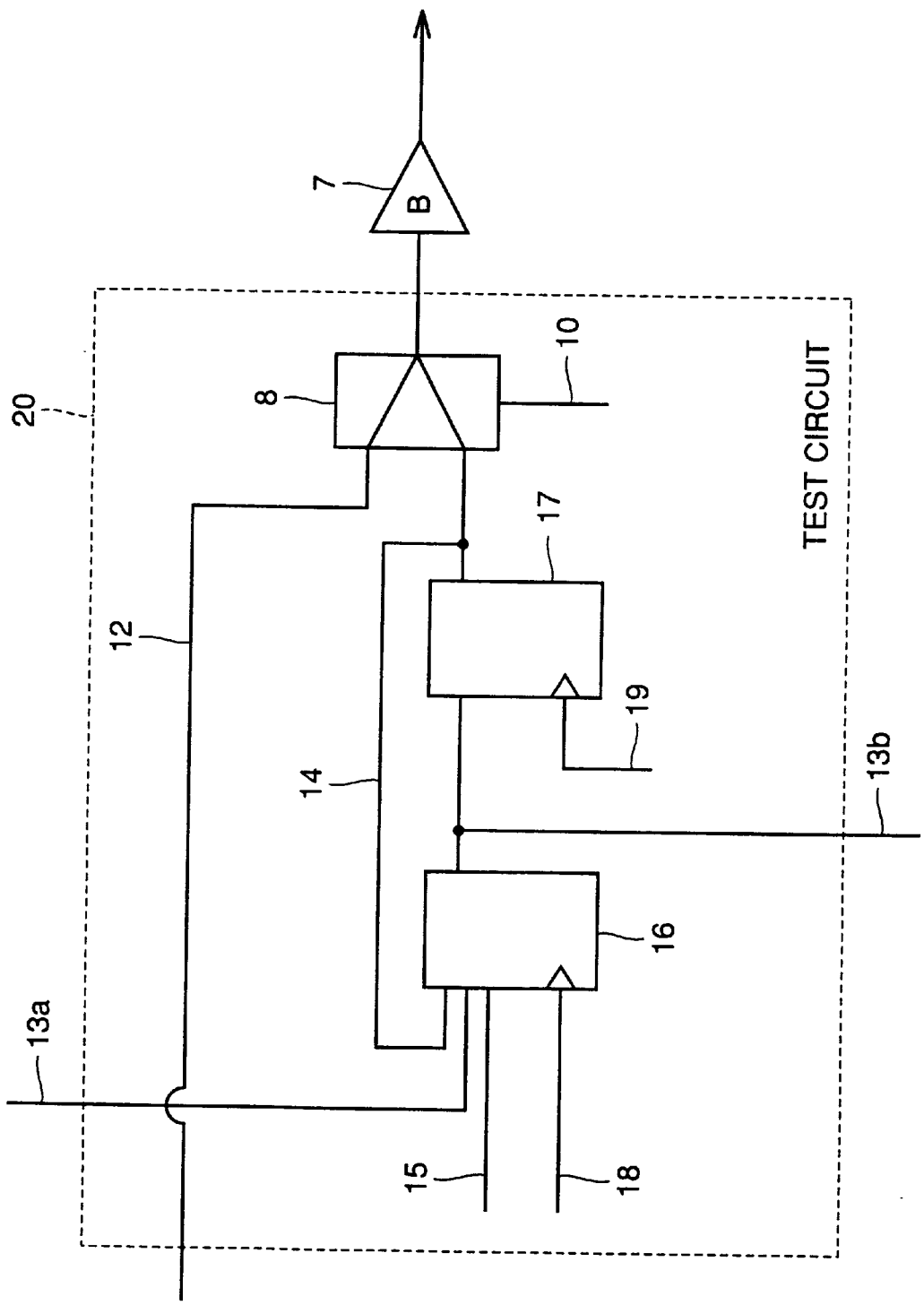
FIG. 3 is a circuit diagram showing the test circuit in accordance with a first embodiment.

Referring to FIG. 3, a test circuit 20 employed in the first embodiment includes: a signal line 13a transmitting test data from a shift register in a preceding stage; a shift register 16 selecting one of signal line 13a and a hold signal line 14, which will be later described, in accordance with a value of a data selection signal line 15, and responsive to a clock signal applied from a shift clock signal line 18 for receiving and outputting test data from one of signal lines 13a and 14; a signal line 13b transmitting the test data output from shift register 16 to a shift register in a succeeding stage; an update register 17 receiving the test data from shift register 16, and retaining and outputting the test data in response to a clock signal applied from update clock signal line 19; a hold signal line 14 transmitting the test data output from update register 17 to an input of shift register 16; a signal line 12 transmitting a signal supplied from a system logic; and a selector 8 selecting an outputting one of a value of signal line 12 and the test data output from update register 17 in accordance with a value of a DCtestSelect signal line 10. An output from selector 8 is externally output through output buffers 7.

In DC testing, test data retained in update register 17 can be output from output buffer 7 by manipulating the value of DCtestSelect signal line 10.

Figure 4:
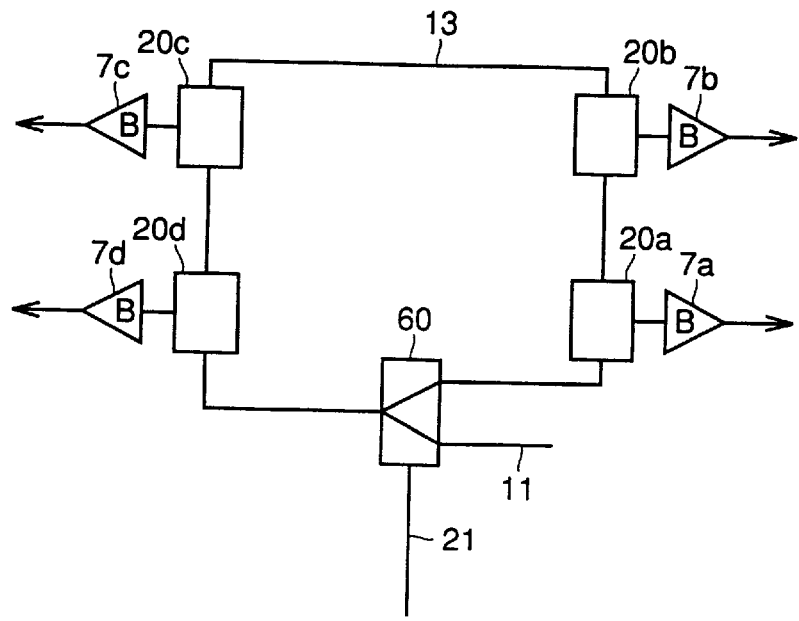
FIG. 4 is a circuit diagram showing the test circuit for DC testing in accordance with the first embodiment.

Referring to FIG. 4, a test circuit for DC testing includes: four test circuits 20a to 20d; four output buffers 7a to 7d respectively corresponding to test circuits 20a to 20d; a signal line 13 transmitting test data; and a selector 60 responsive to a value of a test data selection signal line 21 for selecting and outputting one of two inputs, as described in conjunction with FIG. 3.

Signal line 13a for test circuit 20d is connected to an output of selector 60. Signal line 13a for test circuit 20c is connected to signal line 13b for test circuit 20d. Signal line 13a for test circuit 20b is connected to signal line 13b for test circuit 20c. Signal line 13a for test circuit 20a is connected to signal line 13b for test circuit 20b. Two inputs for selector 60 are respectively connected to signal line 13b for test circuit 20a and a DCtestDataIn signal line 11.

Now, DC test using the test circuit for DC testing will be described as considering simultaneous change of outputs. Assume that, when there are four output buffers 7 as in FIG. 4, simultaneous change constraint is two so that only two of the outputs from output buffers 7 can be changed simultaneously. Thus, in order to set all of the output values from output buffers 7a to 7d at L, output buffers 7a to 7d must be divided into two groups for sequentially changing the output values to L. At the time, while several combinations of output buffers are possible, combinations of output buffers allowing the largest possible space therebetween is desired, such as groups of (output buffers 7a, output buffer 7c) and (output buffer 7b, output buffer 7d).

The test circuit with such shift operation is generally structured such that data is shifted to the adjacent buffer on a chip. Accordingly, by dividing output buffers into groups to allow spaces therebetween, current load may be dispersed to a plurality of power supply pins distributed on the chip, thereby preventing local generation of loud noise.

Based on the grouping, the following process is performed to output L signals from output buffers 7a and 7c.

A pattern supply unit 4 sets a value of data selection signal line 15 as an input for shift register 16 so as to select a value of hold signal line 14, for each of test circuits 20a to 20d. Thereafter, a clock is applied to shift register 16 through a shift clock 18. The operation allows data, currently output through output buffers 7a to 7d, to be set in shift register 16 for each of test circuits 20a to 20d.

Then, pattern supply unit 4 performs shift operation four times to set the output values from output buffers 7a and 7c to L, while circulating the data which has been set in shift register 16 for each of output buffers 7a to 7d once. The data output from selector 60 during the first shift operation would be set in output buffer 7a after the fourth shift operation. Thus, an L signal is set as a value of DCtestDataIn signal line 11, and a value of test data selection signal line 21 is set such that the value of DCtestDataIn signal line 11 is selected as an output signal from selector 60. The clock is then applied to shift register 16 for each of test circuits 20a to 20d. It is noted that the value of data selection signal line 15 is set in each shift register 16 such that data for signal line 13a is set during shift operation. The operation executes the first shift operation.

Data output from selector 60 during next shift operation is data which would be output from output buffer 7b after the fourth shift operation. Data for signal line 13b in test circuit 20a is set to data which is currently output from output buffer 7b. Data output from output buffer 7b are not changed during these four shift operations. Thus, pattern supply unit 4 sets a value of test data selection signal line 21 such that data for signal line 13b in test circuit 20a is selected as an output signal from selector 60. Thereafter, a clock is applied to shift register 16 for each of test circuits 20a to 20d. This executes the second shift operation.

Similarly, pattern supply unit 4 sets the value (L signal) for DCtestDataIn signal line 11 as the output signal from selector 60 so as to set data output from output buffer 7c, and performs the third shift operation. Further, pattern supply unit 4 sets data for signal line 13b in test circuit 20a as the output signal from selector 60 so as to set data output from output buffer 7d, and performs the fourth shift operation.

Through the process hereinbefore, the L signal is retained in shift register 16 for test circuits 20a and 20c. In addition, the values which have been output from output buffers 7b and 7d before the fourth shift operation are retained in shift registers 16 for test circuits 20b and 20d, respectively.

Thereafter, pattern supply unit 4 applies a clock signal to update register 17 for each of test circuits 20a to 20d. Then, the values which have been set in shift registers 16 are retained in update registers 17, and the values which have been retained in update registers 17 are output from output buffers 7a to 7d through selectors 8. It is noted that the value of DCtestSelect signal line 10 is set to select the output from update register 17. At the time, it is guaranteed that data output from output buffers 7b and 7d would not be changed. Thus, the number of outputs which would change is two at most, satisfying simultaneous change constraint.

Similarly, by performing shift operation four times and updating the data retained in update register 17 once, pattern supply unit 4 sets the data output from output buffers 7b and 7d at L. The process described herein before allows output data from all output buffers 7a to 7d to L, while satisfying simultaneous change constraint. Thus, a DC measurement unit 5 can measure output buffer characteristics when the outputs from output buffers 7a to 7d are at L. Similarly, pattern supply unit 4 can set output values from all output buffers 7a to 7d to H and DC measurement unit 5 can measure output buffer characteristics when the output values from output buffers 7a to 7d are at H.

It is noted that, in the present embodiment, while simultaneous change constraint for output buffers 7a to 7d is two, it may be determined more precisely, for example by considering total current amount flowing through output buffers 7a to 7d or the position of power supply pins.

The DC test unit for output buffers in accordance with the first embodiment is the same as that for the conventional example. Thus, DC measurement of output buffers 7a to 7d can be accomplished in the same manner as the conventional example if the function pattern for executing the above described process is preliminary prepared.

In the present embodiment, while several different patterns can be considered, operational procedure of the DC test unit for output buffers can be uniquely determined in accordance with simultaneous change constraint. Thus, only simultaneous change constraint may be set by a designer so that, based on the simultaneous change constraint, the function pattern is automatically produced by a computer.

In addition, while the test circuit for DC testing in accordance with the first embodiment includes only output buffers 7a to 7d as output allowable buffers, when a bidirectional buffer is included, similar DC test is accomplished by preparing a circuit in which the bidirectional buffer is fixed to output mode and by fixing the bidirectional buffer to output mode. More specifically, it is accomplished by preparing a circuit similar to test circuit 20 described with reference to FIG. 3 for controlling input/output of the bidirectional buffer and by controlling it by pattern supply unit 4 so that the bidirectional buffer is fixed to output mode and the value of update register 17 is output from the bidirectional buffer.

Second Embodiment

Figure 5:
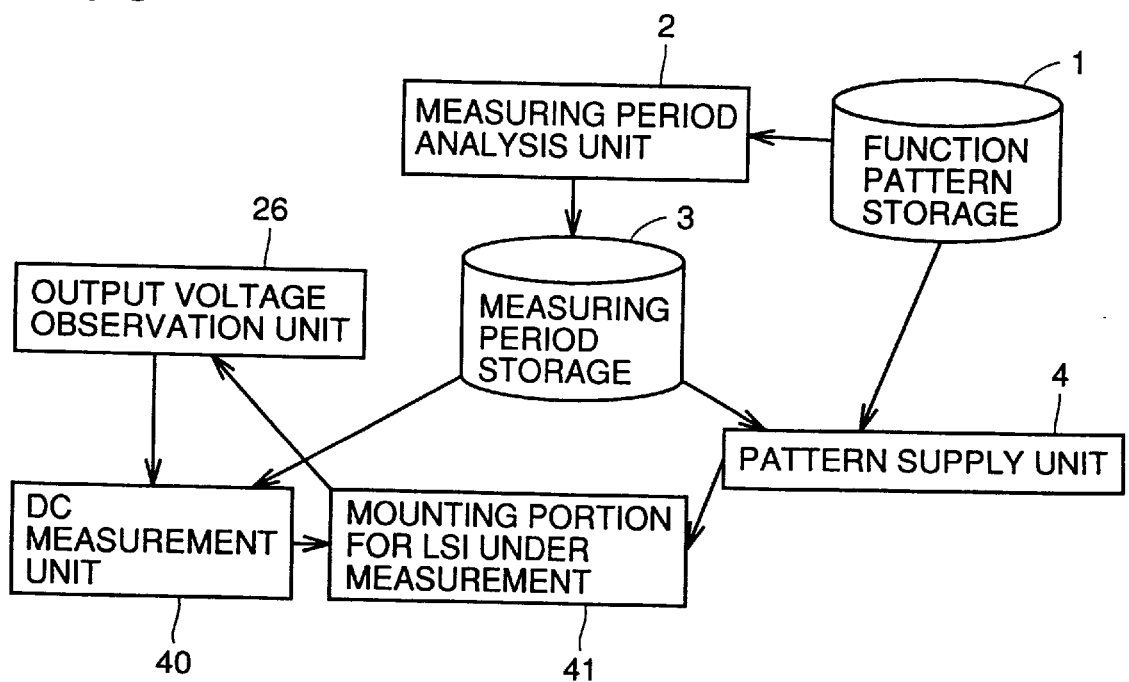
FIG. 5 is a block diagram showing the structure of a DC test unit for output buffers in accordance with a second embodiment.

Referring to FIG. 5, a DC test unit for output buffers in accordance with a second embodiment includes: a function pattern storage 1 for storing a function pattern prepared by a designer; a measuring period analysis unit 2 connected to function pattern storage 1 and analyzing periods at which DC testing for a plurality of output allowable buffers should be performed based on the function pattern; a measuring period storage 3 connected to measuring period analysis unit 2 and storing analysis result obtained from measuring period analysis unit 2; a pattern supply unit 4 connected to function pattern storage 1 and measuring period analysis unit 3, and supplying the function pattern for an LSI under measurement in accordance with a measuring period; a mounting portion for an LSI under measurement 41 to which the LSI under measurement is mounted and for which the pattern is supplied from pattern supply unit 4; an output voltage observation unit 26 observing voltages of output allowable buffers for the LSI under measurement; and a DC measurement unit 40 receiving the voltages of the output allowable buffers for the LSI under measurement from output voltage observation unit 26 and the measuring period for DC testing from measuring period storage 3, and performing DC testing for the LSI under measurement mounted to the mounting portion for the LSI under measurement for each measuring period.

Figure 6:
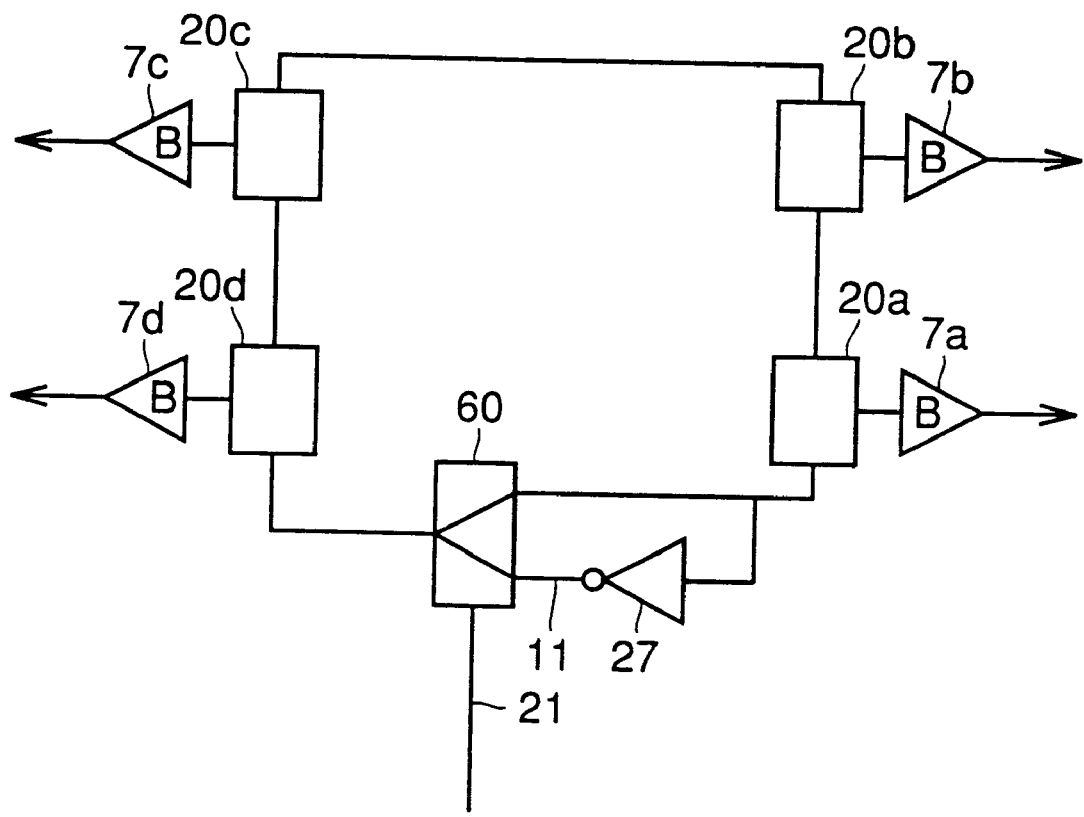
FIG. 6 is a circuit diagram showing a test circuit for DC testing in accordance with the second embodiment.

Referring to FIG. 6, the test circuit for DC testing employs the value of signal line 13b in test circuit 20a after passing an NOT gate 27, that is, a negation value of the value of signal line 13b in test circuit 20a, instead of the value of DCtestDataIn signal line 11 which is an input for selector 60 in a test circuit for DC testing in accordance with the first embodiment described with reference to FIG. 4.

DC test using the test circuit for DC testing while considering simultaneous change of the outputs will now be described. Here, assume that simultaneous change constraint is two as in the first embodiment. In addition, grouping of output buffers 7a to 7d is accomplished in the same way as in the first embodiment.

Pattern supply unit 4 sets data for DCtestSelect signal line 10 such that data retained in update registers 17 are output from output buffers 7a to 7d. Output voltage observation unit 26 observes output voltages for output buffers 7a to 7d. When output voltages for output buffers 7a to 7d are respectively at L, H, L and L, for example, DC measurement unit 40 performs DC testing at L voltage for output buffers 7a, 7c and 7d. As for output buffer 7b, DC testing at H voltage is performed.

Thereafter, signals which are inverse of currently output signals are set to output buffers 7a to 7d for DC testing. Thus, output values for output buffers 7a to 7d are set in accordance with the following procedure.

Pattern supply unit 4 sets data output from output buffers 7a to 7d to shift registers 16 in test circuits 20a to 20d. Thus, data for data selection signal line 15 is set such that data for hold signal lines 14 are selected as inputs for shift registers 16.

Thereafter, pattern supply unit 4 performs shift operation four times so as to set an inverted value of the data currently output from the output buffers to the output data from output buffers 7a and 7c, while circulating data set in output buffers 7a to 7d once. The data output from selector 60 during the first shift operation is the data which would be set in output buffer 7a after the fourth shift operation. Thus, the value of test data selection signal line 21 is set such that the inverted value of the data for signal line 13b in test circuit 20a is selected as an output signal from selector 60. Thereafter, clocks are applied to shift clocks 18 in test circuits 20a to 20d. It is noted that the value of data selection signal line 15 is set to each shift register 16 such that data for signal line 13a is set during shift operation. The operation executes the first shift operation.

The data output from selector 60 during next shift operation is data which would be output from output buffer 7b after the fourth shift operation. The data for signal line 13b in test circuit 20a is set to the data which is currently output from output buffer 7b. The data output from output buffer 7b is not changed through the four shift operations. Thus, pattern supply unit 4 sets the value of test data selection signal line 21 such that data for signal line 13b in test circuit 20a is selected as the output signal from selector 60. Then, clocks are applied to shift clocks 18 for shift registers 16 in test circuits 20a to 20d. The operation executes the second shift operation.

Similarly, pattern supply unit 4 sets an inverted value of the data for signal line 13b in test circuit 20a as the output signal from selector 60 so as to set data output from output buffer 7c for the third shift operation. In addition, pattern supply unit 4 sets the data for signal line 13b in test circuit 20a as the output signal from selector 60 so as to set the data output from output buffer 7d for the fourth shift operation.

Through the process hereinbefore, inverted values of the values, which have been respectively output from output buffers 7a and 7c before the shift operation are retained in shift registers 16 for test circuits 20a and 20c. In addition, the values which have been output from output buffers 7b and 7d before the shift operation are retained in shift registers 16 for test circuits 20b and 20d.

Assume that, for example, output voltages from output buffers 7a to 7d before the shift operation are respectively at L, H, L and L. Then, the values of the shift registers for test circuits 20a to 20d are respectively at H, H, H and L.

Thereafter, pattern supply unit 4 applies clocks to update registers 17 for test circuits 20a to 20d. Then, the values which have been set in shift registers 16 are retained in update registers 17, and the values which have been retained in acted registers 17 are output from output buffers 7a to 7d through selectors 8. It is noted that the value of DCtestSelect signal line 10 is set so as to select outputs from update registers 17. At the time, it is guaranteed that only the data output from output buffers 7a and 7c will change. Thus, the number of outputs which would change will not exceed two, thereby satisfying simultaneous change constraint.

Similarly, by performing shift operation four times and updating the data retained in update register 17 once, pattern supply unit 4 sets inverted values for the values which have been output from output buffers 7b and 7d before the shift operations to the data output from output buffers 7b and 7d. Through the process hereinbefore, pattern supply unit 4 can set inverted values for the values, which have been output from output buffers 7a to 7d at the start of DC testing, to the data output from output buffers 7a to 7d, satisfying simultaneous change constraint. Thus, DC measurement unit 40 performs DC testing for output buffers 7a to 7d at voltages where L and H are interchanged with respect to the output voltages which were observed by output voltage observation unit 26 last time. More specifically, if the output voltages for output buffers 7a to 7d at the first DC testing was respectively at L, H, L and L, the output voltages for output buffers 7a to 7d are currently set at H, L, H and H, respectively. Thus, DC testing at H voltage is performed for output buffers 7a, 7c, and 7d. On the other hand, DC testing at L voltage is performed for output buffer 7b.

In the DC test unit for output buffers in accordance with the second embodiment, output voltage observation unit 26 observes the output voltages for output buffers 7a to 7d, and DC measurement unit 40 performs DC testing based on the output voltages. Further, pattern supply unit 4 sets voltages which are reverse of the currently observed output voltages as the output voltages for output buffers 7a to 7d, and DC measurement unit 40 performs DC testing. As a result, in the present embodiment, setting of the output voltages for output buffers 7a to 7d is required only once, less than the first embodiment which required twice, so that the amount of data for the required function pattern are reduced to half. In addition, the amount of time required for DC testing is effectively reduced.

Further, in the DC testing unit for output buffers in accordance with the second embodiment, the required function patterns are always the same regardless of the initial output data for output buffers 7a to 7d. Accordingly, the DC test unit for output buffers can be implemented simply by adding output voltage observation unit 26 observing the output voltages for output buffers 7a to 7d to the conventional DC test unit for output buffers, by improving DC measuring unit 40 so as to allow DC measuring in accordance with the output from output voltage observation unit 26 and further by improving the mounting portion for an LSI under measurement so that the output voltages for output buffers 7a to 7d are observed by output voltage observation unit 26. Thus, the DC test unit for output buffers in accordance with the second embodiment is achieved by adding a little modification to the conventional DC test unit for output buffers.

Third Embodiment

In the first and second embodiments, DC testing using a unique test circuit 20 is described. In a third embodiment, DC testing using a boundary scan circuit which is standardized in IEEE 1149.1 will be described.

Figure 7:
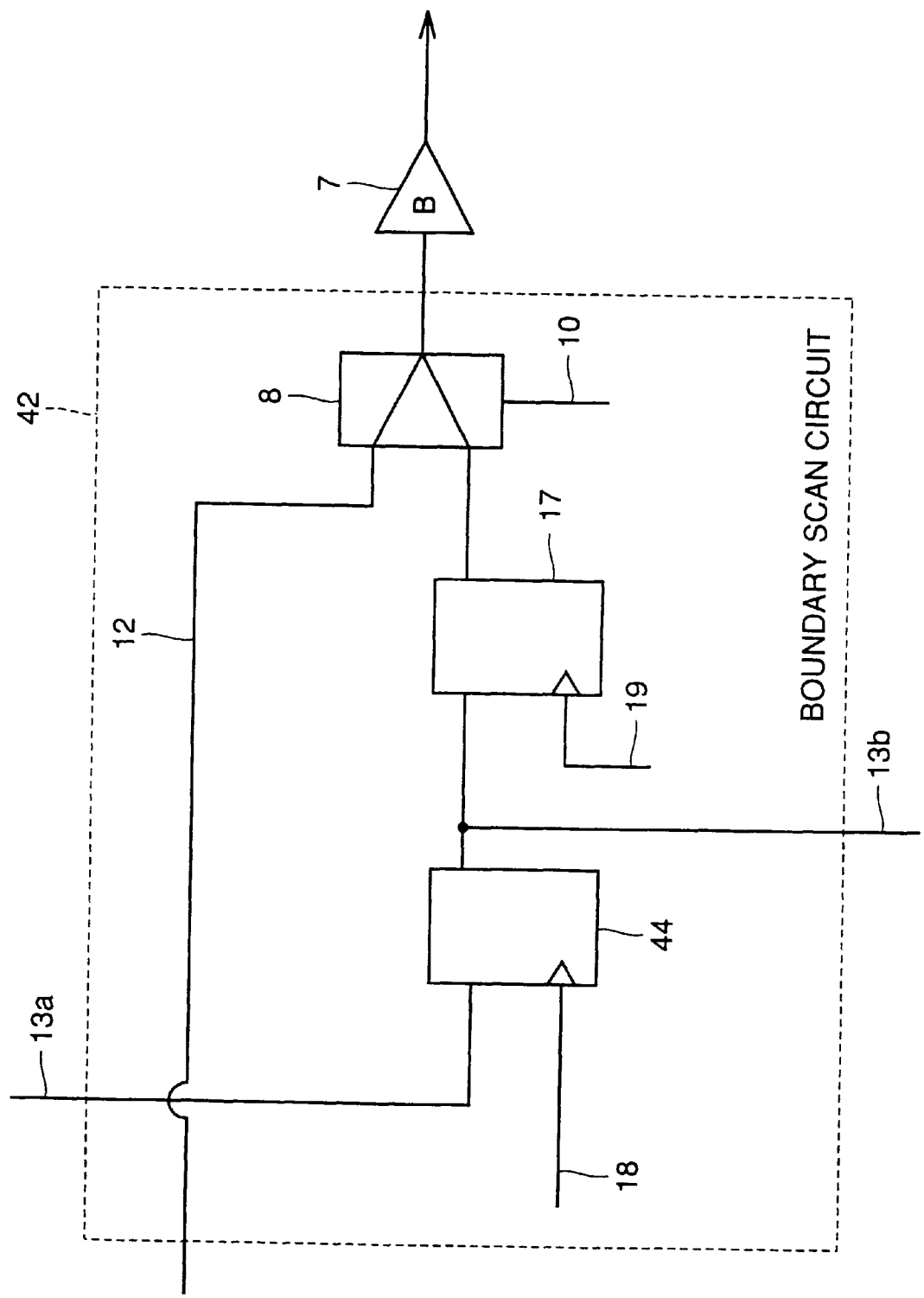
FIG. 7 is a circuit diagram showing a boundary scan circuit standardized in IEEE1149.1.

Referring to FIG. 7, a boundary scan circuit 42 includes: a signal line 13a for transmitting test data from a shift register in a preceding stage; a shift register 44 responsive to a clock signal applied from a shift clock signal line 18 for retaining and outputting a value of signal line 13a; a signal line 13b for transmitting the test data output from shift register 44 to a shift register in a next stage; an update register 17 responsive to a clock signal applied from an update clock signal line 19 for retaining and outputting data output from shift register 44; a signal line 12 for transmitting a signal supplied from a system logic; and a selector 8 for selecting and outputting one of a value of signal line 12 and test data output from update register 17 in accordance with a value of a DCtestSelect signal line 10. The output from selector 8 is externally output through an output buffer 7. It is noted that an output allowable bidirectional buffer may be used instead of output buffer 7.

Figure 8:
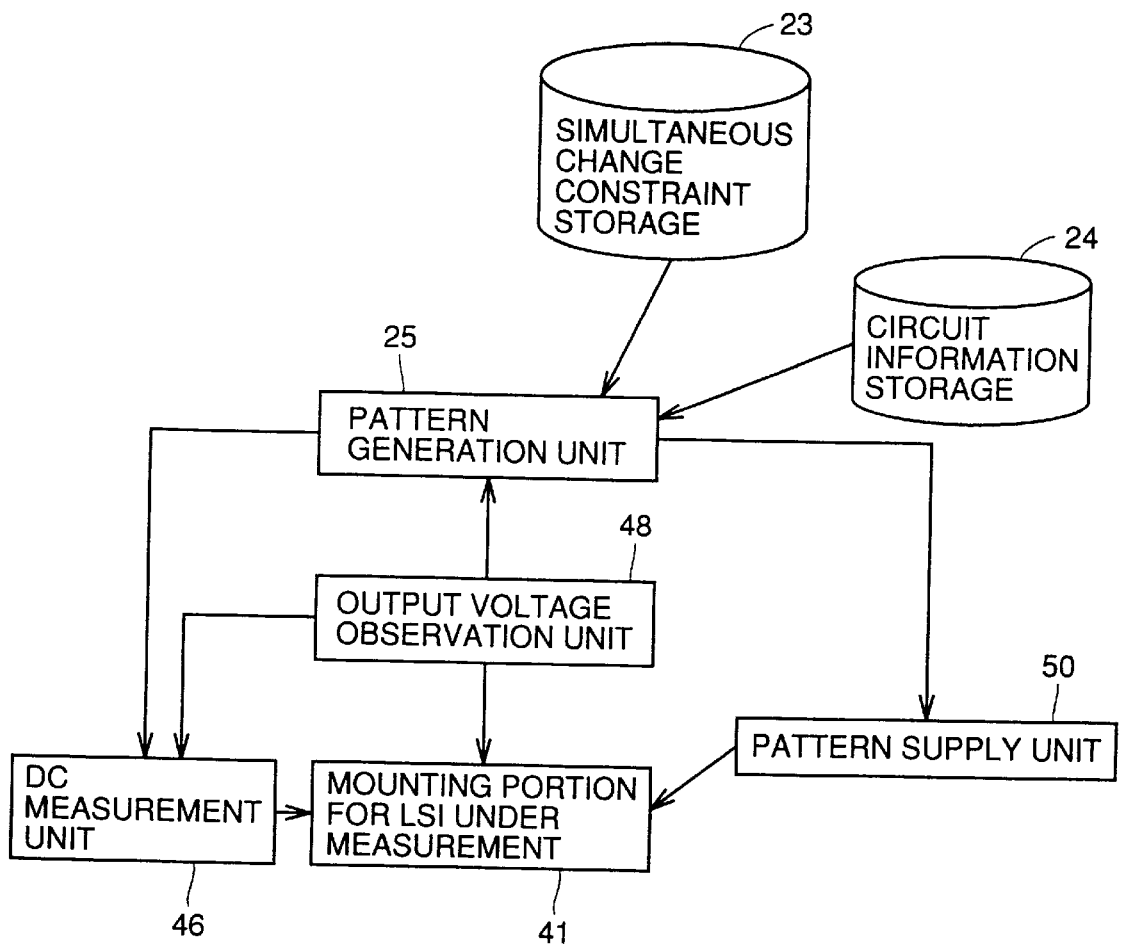
FIG. 8 is a block diagram showing the structure of a DC test unit for output buffers in accordance with a third embodiment.

Referring to FIG. 8, the DC test unit for output buffers in accordance with a third embodiment includes: a simultaneous change constraint storage 23 for storing simultaneous change constraint permitted to an LSI under measurement; a circuit information storage 24 for storing circuit information of the LSI under measurement; a pattern generation unit 25 connected to circuit information storage 24, simultaneous change constraint storage 23 and an output voltage observation unit 48, which will be later described, for generating a function pattern for DC testing based on circuit information of the LSI under measurement, simultaneous change constraint and output voltages output from output buffer 7 and the bidirectional buffer of the LSI under measurement; output voltage observation unit 48 for observing the output voltages output from output buffer 7 and the bidirectional buffer of the LSI under measurement mounted on a mounting portion for the LSI under measurement 41, which will be later described; a pattern supply unit 50 connected to pattern generation unit 25 for supplying the function pattern for the LSI under measurement; mounting portion for the LSI under measurement 41 to which the LSI under measurement is mounted and for which the pattern is supplied from pattern supply unit 50; and a DC measurement unit 46 connected to pattern generation unit 25 for performing DC testing of the LSI under measurement which is mounted to a mounting portion for the LSI under measurement 6 based on the output voltage output from output voltage observation unit 48 and the function pattern output from pattern generation unit 25.

Simultaneous change constraint, which should be satisfied by the LSI under measurement, is set in simultaneous change constraint storage 23 in DC testing. As in the DC test unit for output buffers in accordance with the first embodiment, two is set as simultaneous change constraint.

When DC testing is performed using boundary scan circuit 42, pattern generation unit 25 loads an EXTEST instruction to an instruction register (not shown) through a TAP (Test Access Port). When the EXTEST instruction is loaded into the instruction register, a value of update register 17 is output to an output port (not shown) through output buffer 7. Output voltage observation unit 48 observes voltage at each output port. DC measurement unit 46 performs the first DC testing in accordance with the voltage at the output port.

Then, pattern supply unit 50 changes the values output from output buffer 7 and the bidirectional buffer while satisfying simultaneous change constraint. Prior to the process, pattern generation unit 25 has generated the function pattern. It is noted that boundary scan circuit 42 does not have any means for transmitting the value of update register 17 to shift register 44. Thus, pattern generation unit 25 generates the function pattern based on the information from output voltage observation unit 48.

Figure 9:
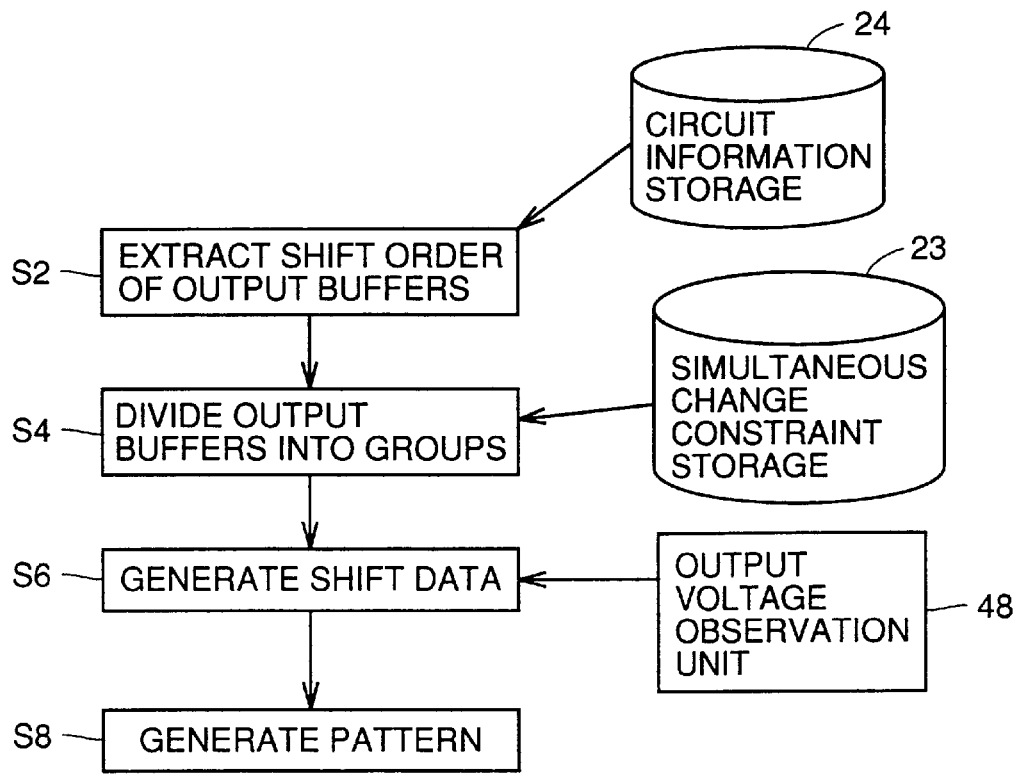
FIG. 9 is a flow chart showing the process performed in the DC test unit for output buffers in accordance with the third embodiment.

Referring to FIG. 9, the operation of pattern generation unit 25 for generating the function pattern will be described. Pattern generation unit 25 reads circuit information of the LSI under measurement out of circuit information storage 24 and obtains shift order of output allowable buffers in the LSI under measurement (S2). As in the first and second embodiments, assume that there are four output allowable buffers, output buffers 7a to 7d, and the shift order of these buffers is 7a, 7b, 7c and 7d. The description of the present embodiment will proceed based on this assumption.

Thereafter, pattern generation unit 25 reads the value of simultaneous change constraint out of simultaneous change constraint storage 23. In addition, it divides output buffers 7a to 7d into groups so as to satisfy simultaneous change constraint (S4). If two has been set as simultaneous change constraint, pattern generation unit 25 divides output buffers 7a to 7d into groups so as to allow the largest possible space therebetween. Here, assume that output buffers 7a to 7d are divided into groups of (output buffers 7a, 7c) and (output buffers 7b, 7d).

Pattern generation unit 25 obtains shift data which would be shifted and sequentially set into shift register 44 in boundary scan circuit 42 based on the currently set information of grouping and output voltages for output buffers 7a to 7d observed by output voltage observation unit 48 (S6). As an example, the case where L, H, L and L are respectively observed as the output voltages for output buffers 7a to 7d will be described. During the first pattern supply, pattern supply unit 50 supplies shift data for inverting output voltages for output buffers 7a and 7c. Thus, pattern generation unit 25 generates shift data such that output voltages for output buffers 7a to 7d are respectively at H, H, H, and L in the first pattern supply. A number of boundary scan circuits 42 are connected to the input port in the LSI under measurement. The input port is not however related to DC testing. Thus, shift data, which should be set in shift register 44 in boundary scan circuit 42 connected to the input port, is set to an arbitrarily value.

In the second pattern supply, pattern supply unit 50 supplies shifted data for inverting output voltages for output buffers 7b and 7d. Thus, pattern generation unit 25 generates shift data such that output voltages for output buffers 7a to 7d are respectively at H, L, H and in a second pattern supply, as in the first shift data generation.

Pattern supply unit 50 can set the shift data in update register 17 in boundary scan circuit 42 by controlling the TAP in accordance with the procedure determined in IEEE1149.1. Pattern generation unit 25 generates the function pattern based on the shift data, which pattern will be supplied to the LSI under measurement by pattern supply unit 50 (S8).

Pattern supply unit 50 performs shift operation while supplying the function pattern for the LSI under measurement in accordance with the prescribed procedure. When pattern supply unit completes the last shift operation, DC measurement unit 46 can perform DC testing. Thus, DC measurement unit 46 performs DC testing for output buffers 4a to 4d at a voltage which is reverse of that measured in the first DC testing.

Boundary scan circuit 42 which is standardized in IEEE was employed in the DC testing in accordance with the present embodiment. The required function pattern is thereby readily produced. In addition, boundary scan circuit 42 may also be employed as a circuit for board testing. Therefore, the number of circuits to be added to the LSI is minimized in LSI designing.

Fourth Embodiment

A DC test unit for output buffers in accordance with a fourth embodiment is similar to the conventional DC test unit for output buffers described with reference to FIG. 1.

In addition, in the fourth embodiment, DC testing is performed using boundary scan circuit 42 described with reference to FIG. 7.

Figure 10:
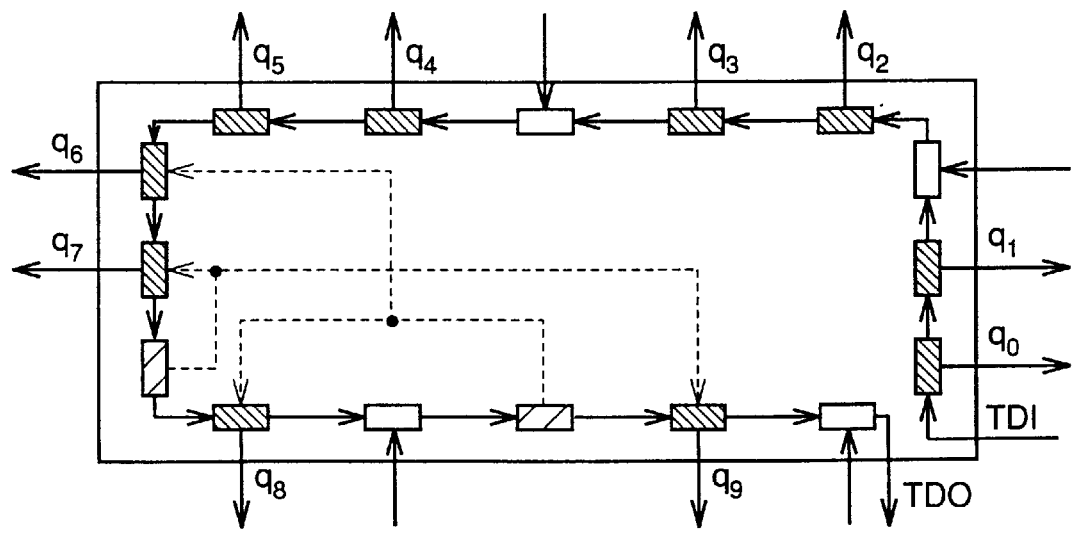
FIG. 10 is a diagram showing the connection for the boundary scan circuit in accordance with a fourth embodiment.

Boundary scan circuits 42 are connected in an LSI under measurement as shown in FIG. 10. In the drawing, $q_0$ to $q_9$ represent outputs from output allowable buffers.

The test unit for output buffers loads an EXTEST instruction to an instruction register through a TAP as in the third embodiment. L voltage is thereby retained in all update registers 17. In this state, values for $q_0$ to $q_9$ are all at L. Thus, a DC measurement unit 5 performs DC testing at L voltage.

Thereafter, as in the third embodiment, the values for $q_0$ to $q_9$ are sequentially set at H while satisfying simultaneous change constraint, and DC testing at H voltage is performed.

Now, how to obtain combinations of the output allowable buffers so as to satisfy simultaneous change constraint will be described. Here, the set of outputs from the output allowable buffers is defined as Q. In the present embodiment, assume that $Q=\{q_0, q_1, q_2, q_3, q_4, q_5, q_6, q_7, q_8, q_9\}$, where the elements of set Q are connected in the arranged order shown in FIG. 10. The number of elements of set Q and simultaneous change constraint are respectively defined as d and M. In the present embodiment, d=10 and M=3. The smallest number of combinations P of the output allowable buffers satisfying simultaneous change constraint is obtained in accordance with the following equation.

$$P = \left\lceil \frac{d}{M} \right\rceil$$

In the present embodiment, P=4. Then, sub sets of Q is obtained by taking P elements of Q from head end at a time. In the present embodiment, three sub sets, $Qp(0)=\{q_0, q_1, q_2, q_3\}$, $Qp(1)=\{q_4, q_5, q_6, q_7\}$ and $Qp(2)=\{q_8, q_9\}$ are obtained.

By taking the head end element out of each sub set, sub sets of Q are further obtained. In a present embodiment, four sub sets, $Q0=\{q_0, q_4, q_8\}$, $Q1=\{q_1, q_5, q_9\}$, $Q2=\{q_2, q_6\}$ and $Q3=(q_3, q_7)$, are obtained. These sub sets Q0 to Q3 are combinations of the outputs from the output allowable buffers which can be simultaneously changed. Sub sets Q0 to Q3 thus obtained are satisfying simultaneous change constraint, and the outputs from the output allowable buffers, which are elements of each subset, are spaced apart.

In this DC testing in accordance with the present embodiment, simultaneous change constraint is not guaranteed when the values for $q_0$ to $q_9$ are set at L. To solve this problem, for example, a parallel output register (not shown) may be set at L in a Test-Logic-Reset state for the TAP.

Boundary scan circuit 42 standardized in IEEE 1149.1 was employed in DC testing in accordance with the present embodiment. The required function pattern can be thereby readily generated. In addition, boundary scan circuit 42 may be employed as a circuit for board testing, so that the number of circuits to be added to an LSI in LSI designing is minimized. Further, the DC test unit for output buffers may be the conventional one. Thus, simple DC testing considering simultaneous change constraint can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test circuit for DC testing an LSI, comprising:

a plurality of test circuits capable of retaining values output from a plurality of output allowable buffers and supplying the values for said plurality of output allowable buffers;

a selector connected to a first test circuit included in said plurality of test circuits and a data signal line, and responsive to a data selection signal for selecting one of a value retained in said first test circuit and a value of said data signal line and for supplying it for a second test circuit included in said plurality of test circuits; and a signal line connecting said plurality of test circuits and said selector in a circle so as to circulate the value retained in said plurality of test circuits between said plurality of test circuits.

2. The test circuit for DC testing in accordance with claim 1, wherein each of said plurality of test circuits includes an update register responsive to an update clock for updating a state and retaining a value which should be output from said output allowable buffer, and a shift register connected to an output from said update register and an output from a shift register in a preceding stage or from said selector, and responsive to a shift clock for retaining one of a value of the output from said updated register selected in accordance with the data selection signal and a value of the output from the shift register in said preceding stage or from said selector and for applying said retained value to an input for a shift register in a succeeding stage or to an input for said update register.

3. The test circuit for DC testing in accordance with claim 1, further including an NOT gate for inverting the value retained in said first test circuit, said data signal line being connected to an output of said NOT gate.

4. The test circuit for DC testing in accordance with claim 3, wherein each of said plurality of test circuits includes an update register responsive to an update clock for updating a state and retaining a value which should be output from said output allowable buffer, and a shift register connected to an output for said update register and an output from a shift register in a preceding stage or from said selector, and responsive to a shift clock for retaining one of a value of the output from said update register selected in accordance with a data selection signal and a value of the output from the shift register in said preceding stage or from the output from said selector and for applying said retained value to an input for a shift register in a succeeding stage or for said update register.

5. A method of DC testing using a test circuit for DC testing, said test circuit for DC testing including a plurality of test circuits capable of retaining values output from a plurality of output allowable buffers and supplying the values for said plurality of output allowable buffers, a selector connected to a first test circuit included in said plurality of test circuits and to a data signal line, and responsive to a data selection signal for selecting one of a value retained in said first test circuit and a value of said data signal line and supplying it for a second test circuit included in said plurality of test circuits, and a signal line for connecting said plurality of test circuits and said selector in a circle so as to circulate the value retained in said plurality of test circuits between said plurality of test circuits, said method comprising:

the step of dividing said plurality of output allowable buffers into groups so as to satisfy simultaneous change constraint;

the step of setting a first prescribed value of circulating the value retained in said plurality of test circuits between said plurality of test circuits once and for simultaneously setting the prescribed value to an output from said output allowable buffer in the group;

the step of setting a second prescribed value of sequentially performing said step of setting the first prescribed value of the output allowable buffers included in each of said groups; and the step of performing DC testing for said plurality of output allowable buffers, said step of setting the first prescribed value including the first step of setting a prescribed value as a value of said date signal line for said selector, the second step of selecting the value of said data signal line and supplying it for said second test circuit by said selector when an output value of the output allowable buffer to which said prescribed value should be set has been applied as an input value of said selector in circulation;

the third step of selecting the output value of said output allowable buffer other than that to which said prescribed value should be set and supplying it to said second test circuit by said selector when the output value of the output allowable buffer other than that to which said prescribed value should be set has been applied as the input value of said selector in circulation; and the fourth step of simultaneously setting the values retained in said plurality of test circuits to said plurality of output allowable buffers.

6. The method of DC testing in accordance with claim 5, wherein each of said plurality of test circuits includes an update register responsive to an update clock of updating a state and retaining a value which should be output from said output allowable buffer, and a shift register connected to an output of said update register and to an output from a shift register in a preceding stage or from said selector, and responsive to a shift clock for retaining one of the output from said update register selected in accordance with data selection signal and an output from the shift register in said preceding stage or from said selector and applying the retained value to an input for a shift register in a succeeding stage or for said update register, said second step including the step of selecting the value of said data signal line and supplying it for said shift register in said second test circuit when the output value of said output allowable buffer to which said prescribed value should be set has been applied as an input value of said selector in circulation, said third step including the step of selecting the output value of the output allowable buffer other than that to which said prescribed value should be set and supplying it for said shift register in said second test circuit by said selector when the output value of said output allowable buffer other than that to which said prescribed value should be set has been applied as the output value of said selector in circulation, and said fourth step including the step of applying an update clock to each of said update registers in said plurality of test circuits and updating a state of said update register.

7. A method of DC testing using a test circuit for DC testing, wherein said test circuit for DC testing is a boundary scan circuit standardized in IEEE1149.1, said method comprising:

the step of generating a function pattern for DC testing;

the step of simultaneously and sequentially setting output voltages for said plurality of output allowable buffers group by group using said function pattern while satisfying simultaneous change constraint; and the step of performing DC testing for said plurality of output allowable buffers, said step of generating said function pattern including the step of obtaining shift order for said plurality of output allowable buffers from circuit information of an LSI, the step of dividing said plurality of output allowable buffers into groups so as to satisfy simultaneous change constraint, and the step of generating said function pattern for simultaneously inverting an output value of the output allowable buffer in said groups for each of said groups based on the shift order for said plurality of output allowable buffers and the output values for said plurality of output allowable buffers.

8. The method of DC testing in accordance with claim 7, wherein said step of generating said function pattern includes:

the step of obtaining the shift order for said plurality of output allowable buffers from circuit information of the LSI;

the step of dividing said plurality of output allowable buffers into groups so as to satisfy simultaneous change constraint; and the step of generating the function pattern for simultaneously setting a prescribed value to an output for the output allowable buffers in said groups for each of said groups based on the shift operation for said plurality of output allowable buffers, said step of dividing said plurality of output allowable buffers into groups including the step of calculating a first value from the number of said plurality of output allowable buffers and said simultaneous change constraint, the step of grouping said plurality of output allowable buffers by taking the output allowable buffers out of said plurality of output allowable buffers by the number equal to said first value at a time in accordance with the shift order for said plurality of output allowable buffers and said first value, and the step of further grouping said plurality of output allowable buffers by taking said output allowable buffer from each of said groups one at a time.

* * * * *